United States Patent [19]
Kaufman et al.

[11] Patent Number: 5,517,121
[45] Date of Patent: May 14, 1996

[54] MRI SYSTEM WITH SIDE-ACCESS TO AN IMAGE VOLUME LOCATED WITHIN A TWO-COLUMN MAIN MAGNET

[75] Inventors: Leon Kaufman, San Francisco; Jianhua Li, South San Francisco; Joseph W. Carlson, Kensington; Bruce C. Breneman, San Diego, all of Calif.

[73] Assignee: Toshiba America MRI, Inc., South San Francisco, Calif.

[21] Appl. No.: 372,345

[22] Filed: Jan. 13, 1995

[51] Int. Cl.⁶ ........................................ G01V 3/00
[52] U.S. Cl. ............................. 324/319; 324/320
[58] Field of Search ................... 324/318, 322, 324/300, 307, 309, 320; 128/653.5

[56] References Cited

U.S. PATENT DOCUMENTS

| | | | |
|---|---|---|---|
| 4,771,785 | 9/1988 | Duer | 324/318 |
| 4,829,252 | 5/1989 | Kaufman | 324/309 |
| 4,943,774 | 7/1990 | Breneman et al. | 324/318 |
| 5,307,039 | 4/1994 | Chan et al. | 324/318 |

OTHER PUBLICATIONS

GE Medical System Sales Brochure for Signa Profile, Nov. 1994, 5 pages.

Primary Examiner—Louis M. Arana
Attorney, Agent, or Firm—Nixon & Vanderhye

[57] ABSTRACT

Convenient side access to an image volume located within a two-pole, two-column main magnet of an MRI system is provided by rotating the symmetry axis of the magnet to be non-perpendicular with respect to the longitudinal axis of the patient transport and/or otherwise displacing the two column structures of the magnetic circuit so as to permit open and unobstructed access to the image volume along a direction perpendicular to the longitudinal axis of the patient transport.

18 Claims, 2 Drawing Sheets

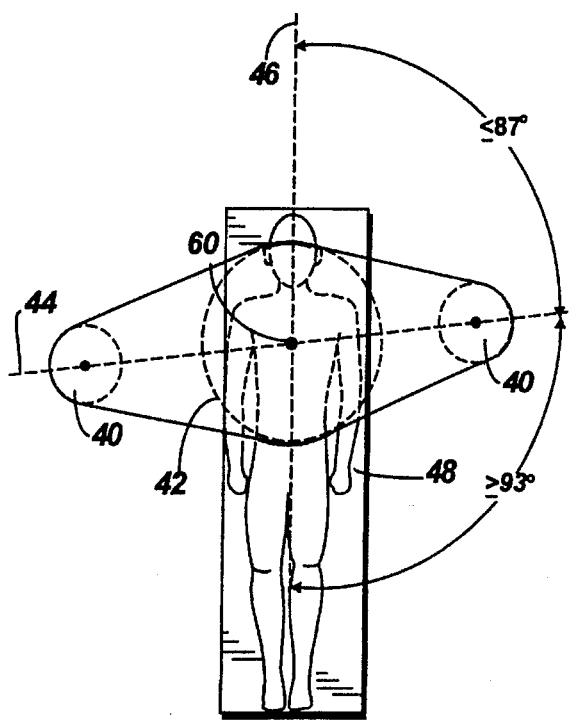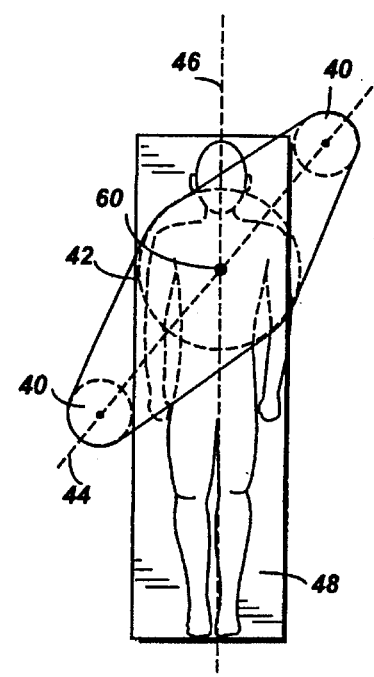
FIG. 3a  FIG. 3b
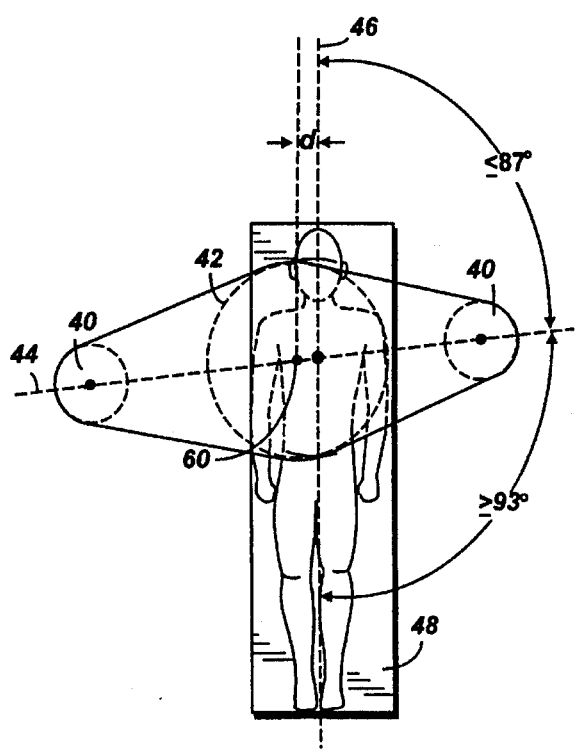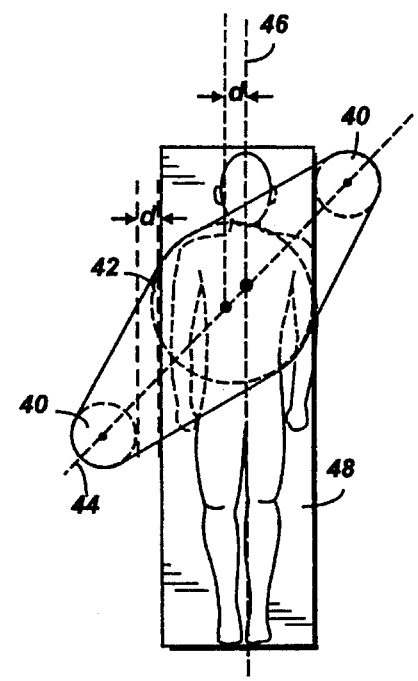
FIG. 4a  FIG. 4b

MRI SYSTEM WITH SIDE-ACCESS TO AN IMAGE VOLUME LOCATED WITHIN A TWO-COLUMN MAIN MAGNET

BACKGROUND OF THE INVENTION

1. Field of the Invention

This invention relates generally to magnetic resonance imaging (MRI) systems. In particular, it relates to the spatial arrangement of a pair of columns in a two-column magnetic circuit of the main static magnetic field generator to permit open and unobstructed access to the image volume along a direction perpendicular to the longitudinal axis of the patient and patient transport mechanism.

2. Related Art

The art of magnetic resonance imaging (MRI) is now well developed and several different types of MRI systems are commercially available. In all of them, some static magnetic field generator is provided to produce a very strong static magnetic field $H_o$ (controlled pulses of spatial gradients along three mutually orthogonal coordinate axes are typically also generated by related structures). The static magnetic field is typically approximately homogenous within a predefined imaging volume (e.g., a spherical volume 30–50 cm in diameter) and the controlled gradients are typically approximately linear with respect to spatial displacements therewithin.

In conjunction with coordinated magnetic gradient pulses, a programmed sequence of radio frequency pulses is transmitted into body portions located within the imaging volume at predetermined frequency distributions so as to selectively nutate the magnetic moment of certain atoms by predetermined amounts in accordance with well-known nuclear magnetic resonance (NMR) principles. After cessation of such transmitted RF pulses, the NMR nutated atoms tend to relax back toward alignment with the static magnetic field $H_o$ and, in the process, produce characteristic NMR RF signals. Such RF signals are received (typically under the influence of a magnetic gradient pulse), detected and processed to thereafter produce a desired MRI image of the body portion located within the imaging area in accordance with any one of many known MRI techniques as will be appreciated by those in the art. As noted, the transmitted RF pulses are synchronized with a special sequence of current pulses passed through various magnetic gradient coils during the imaging process so as to effect spatial information encoding processes and/or to provide known types of NMR phasing control.

In some MRI apparatus, the static magnetic field $H_o$ and/or the magnetic gradient coils are realized in the form of large solenoidal coils or, in the case of Gx, Gy, Gz gradient coils, saddle-shaped coils conformed to a generally tubular configuration. In such cases, it is naturally necessary for patient access to the imaging volume to be provided only along a narrow tunnel through the tubular shaped apparatus. With some patients, this may give rise to claustrophobic reactions. It also makes it extremely cumbersome to access the image volume (e.g., so as to adjust the relative positioning of RF transmit and/or receive coils, to perform interventional procedures on the relevant patient anatomy or to attend to other patient needs).

Other types of MRI systems utilize a pair of magnetic poles (e.g., permanent magnets or electromagnets with ferromagnetic or air cores—possibly with super-conducting windings) disposed on opposite sides of the image volume to create the requisite static magnetic field $H_o$. Necessary magnetic circuits for return flux (i.e., outside the image volume) between the magnetic poles have been proposed in various forms. Presently available commercial devices typical use four columns disposed at the four corners of the main magnet (e.g., see U.S. Pat. No. 4,829,252—Kaufman). Two-column main magnet MRI systems have also been demonstrated and described (e.g., see U.S. Pat. No. 4,943,774—Breneman et al). The entire contents of U.S. Pat. Nos. 4,829,252 and 4,943,774 are hereby incorporated by reference.

As described in U.S. Pat. No. 4,829,252—Kaufman, the earliest use of four-column magnetic circuits did not take any advantage of its potential for open access. Instead, early use of such four-column structures impeded access by various means—except along a narrow patient tunnel aligned with the longitudinal axis of a patient transport mechanism. Accordingly, such early four-column systems were subject to all of the usual claustrophobic patient reactions. They also substantially prevented patient assistance and/or active interventional procedures during what can be a fairly lengthy MRI procedure. The Kaufman '252 patent describes and claims an invention for taking advantage of the four-column magnetic circuit so as to leave the final MRI system with open transverse access from the sides to the patient image volume.

U.S. Pat. No. 4,943,774 is representative of prior art proposals for using only two-columns in the flux return portion of the main magnet magnetic circuit. As described in the '774 patent and as recently demonstrated by others at an industry symposium, the symmetry axis of the two-column magnetic circuit was disposed perpendicular to the longitudinal axis of the patient and patient transport mechanism. The diameter of each return flux column is approximately the same as the diameter of the image volume. Accordingly, even though the two-column structure theoretically presents more overall openness to the image volume, the prior art utilization of such two-column structures has actually resulted in essentially no access to the image volume from directions that are directly perpendicular to the longitudinal axis of the patient and patient transport mechanism. That is, prior art usages of such two-column structures have placed the two columns of the magnetic circuit so as to directly obstruct access to the image volume along a direction perpendicular to the longitudinal patient axis. Presumably such system designs were limited in this fashion out of unfounded fear or concerns (e.g., that any other spatial location of the yoke structures might adversely impact the desired homogeneity of magnetic field within the image volume).

BRIEF SUMMARY OF THE INVENTION

We have now discovered that direct perpendicular access to the image volume may be achieved in a two-column magnetic circuit MRI system by disposing the pair of columns relative to the image volume so as to permit this desired open and unobstructed access from directions perpendicular to the longitudinal patient axis. For example, the longitudinal axis of the patient transport mechanism (and therefore the patient) is preferably disposed at a substantial non-perpendicular angle (e.g., at least 3 degrees more or less than 90°) with respect to a plane passing through the center of each column in a plan view of the system (e.g., the symmetry axis of the magnetic circuit if the columns located on opposite sides of the image volume along a plane passing through the center of the image volume). Preferably the patient transport mechanism is rotated until it is in edge contact with one or both of the columns of the magnetic circuit. While the longitudinal axis of the patient transport mechanism is preferably approximately lined up with and passing through the center of the magnet and image volume, it may also be offset from such an aligned position so as to provide preferential access to at least one side of the structure.

BRIEF DESCRIPTION OF THE DRAWINGS

These as well as other objects and advantages of the invention will be more completely understood and appreciated by careful study of the following detailed description of presently preferred exemplary embodiments of the invention when considered in conjunction with the accompanying drawings, of which:

FIGS. 3a and 3b are schematic plan views of a first embodiment of this invention having a longitudinal axis of the patient transport mechanism approximately lined up with the center of the magnet but substantially rotated (e.g., by at least 3°) with respect to a perpendicular relationship to the symmetry axis of the magnet (FIG. 3a) or so far as to cause the columns to contact the edge of the patient transport mechanism (FIG. 3b); and FIGS. 4a and 4b schematically illustrate plan-views of a second embodiment of this invention which is similar to that depicted in FIGS. 3a and 3b except that the longitudinal axis of the patient transport mechanism is offset from the center of the magnet (e.g., by at least 1 cm) thus causing only one side of the patient transport mechanism to be in contact with one of the column structures as depicted in FIG. 4b.

DETAILED DESCRIPTION OF EXEMPLARY EMBODIMENTS

Figure 1:
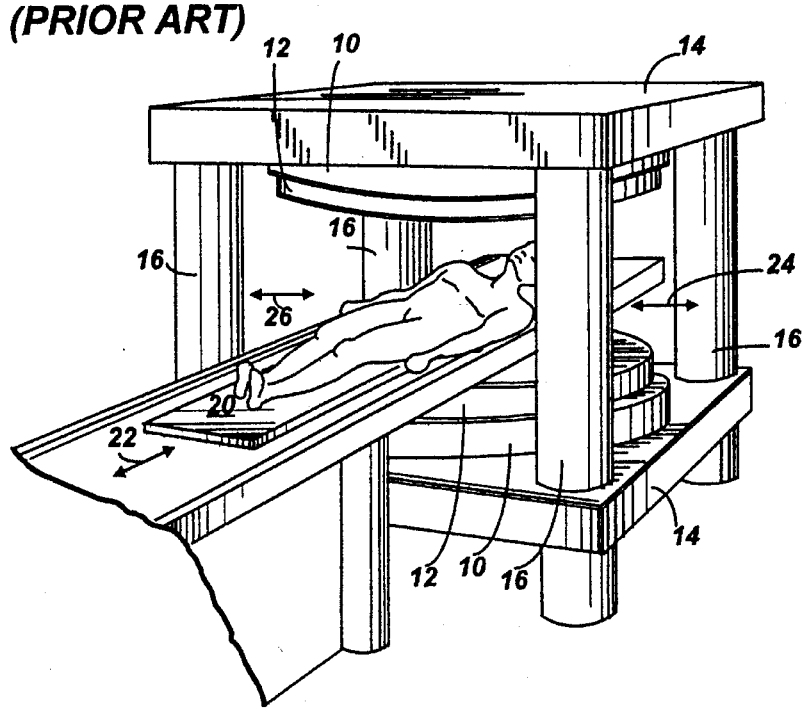
FIG. 1 is a perspective schematic depiction of a prior art four-column magnetic circuit MRI system.

As shown in FIG. 1, a typical prior art four-column magnetic circuit MRI system includes a pair of opposite polarity permanent magnet poles 10 with appropriate shimming face pieces 12 held in place by a magnetically permeable magnetic circuit frame within top and bottom pieces 14 and four-column structure 16 located at the four corners of the structure. A patient transport mechanism 20 permits a patient to be transported along a longitudinal axis 22 into and out of an image volume of substantially homogeneous magnetic field located centrally and centered between pole pieces 10. As described in U.S. Pat. No. 4,829,252—Kaufman, the finished MRI system preferably leaves open perpendicular access to the image volume along access directions 24 and 26 located to either side and perpendicular to the patient transport axis 22.

Figure 2A:
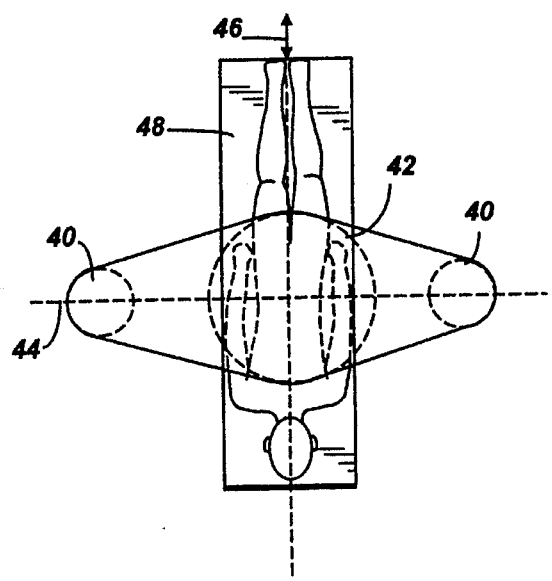
FIGS. 2a and 2b are schematic plan and end-elevational views of a typical prior art two-column magnetic circuit MRI system.
Figure 2B:
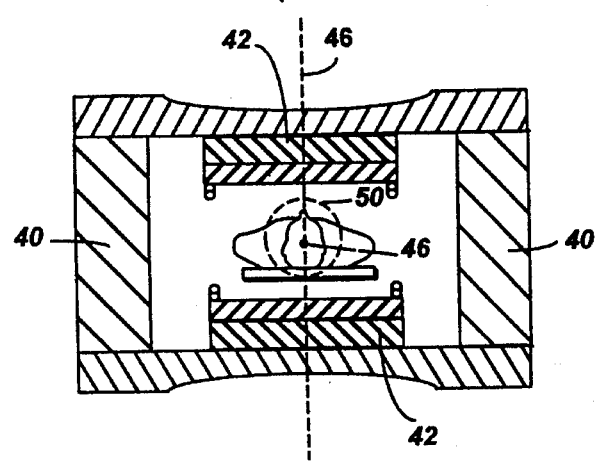

However, when two-column magnetic circuit structures like that of FIGS. 2a–2b have heretofore been considered, the pair of columns 40 have been placed symmetrically on either side of the main magnet poles 42 with the symmetry axis 44 of the main magnetic circuit (which passes through the pair of columns 40) passing perpendicular to the longitudinal axis 46 of the patient transport mechanism 48. Accordingly, such prior art structures have completely obstructed access to the patient image volume 50 along a direction perpendicular to the longitudinal axis 46 of the patient and patient transport mechanism.

Whether the two-pole magnet generates magnetic flux by use of permanent magnets or by electromagnets (either resistive or superconductive), a two-column magnetic circuit can be disposed relative to the image volume so as to still leave open and unobstructed access to the image volume along a direction perpendicular to the longitudinal axis of the patient. For example, the embodiments schematically shown in the plan views of FIGS. 3a–4b all depict a main static magnetic field generator having first and second magnetic poles 42 that are magnetically connected but physically supported and spaced apart from one another by a pair of magnetically permeable columns 40 to define the usual image volume located in an airgap between the poles—and between the columns. As depicted, the magnetic poles 42 have respective transverse central axes that are substantially coincident and passing centrally (vertically) through the image volume at 60. A patient transport 48 is disposed to support a patient within the image volume along a longitudinal axis (actually a plane) 46 of the transport (and of the patient lying thereon). Nevertheless, in all embodiments of this invention, the pair of columns 40 are disposed relative to the image volume so as to permit open and unobstructed access to the image volume—preferably to the center of the image volume located along the coincident vertical and central axes of the poles along a direction perpendicular to the longitudinal axis of the patient transport mechanism.

As depicted in FIGS. 3a–4b, the columns 40 are symmetrically located on opposite sides of the poles 42 so as to define a symmetry axis 44 of the magnetic circuit which passes centrally through the image volume and through each column. The longitudinal axis of the transport is shown at an angle that is off-perpendicular with respect to the symmetry axis in all these embodiments. Since normal system alignments tolerances might arguably result in minor off-perpendicular angles (e.g., of less than about 3°), this invention can be characterized by purposeful, intentional substantial off-perpendicular angles (e.g., where the off-perpendicular angle is greater than 3°—i.e., where the angles between the longitudinal patient axis and the symmetry axis of the magnet are less than 87° and more than 93°).

FIGS. 3a and 3b depict a situation wherein the longitudinal axis of the transport (actually a vertical plane passing through the central longitudinal axes of the patient and patient transport) passes substantially through the vertical central axes of the poles 60. FIGS. 4a and 4b depict a similar situation but wherein the longitudinal axis 46 of the transport 48 is offset by at least 1 cm (d) away from the vertical central axes of the poles. Thus in FIG. 4b, only the righthand edge of transport 48 contacts the righthand column 40. While in FIG. 3b, both left and right edges of the transport 48 contact the respectively associated column 40. As will be appreciated by those in the art, although the maximum possible angle between the symmetry axis 44 of the magnetic circuit and the transverse axis 46 of the patient bed 48 will occur when one or both of the transport edges is in actual contact with its respective column 40, as a practical matter, it will suffice if the angle is sufficiently large to cause one or both of the outer edges (i.e., FIG. 4b or 3b) to be substantially adjacent its respective column—or otherwise angularly disposed sufficient to leave open unobstructed access to all or a desired portion of the image volume from directions perpendicular to the patient axis 46.

As shown in various ways by FIGS. 3a–4b, merely rotating the symmetry axis 44 of the magnetic circuit with respect to the longitudinal axis 46 of the patient transport mechanism (and possibly offsetting of same with respect to the center of the image volume) substantially ameliorates the lack of convenient side access to the patient (e.g., as is desirable for interventional procedures and the like) otherwise caused by the prior art arrangement of two-column magnetic circuit structures. The advantageous geometry is clearly applicable to two-column electromagnets (either superconductive or resistive) as well as permanent magnets or any desired combination thereof.

If the symmetry axis of the magnet does not pass through the center of the two columns, then the angular orientation between the patient transport and a line passing through the two column centers is $90 \pm |\theta|$ where $|\theta|$ is $>30°$.

As will be understood, the orientation of the two-column magnetic circuit about the patient's longitudinal axis can be changed (e.g., rotated) if desired without losing the open unobstructed side access as described herein.

While only a few exemplary embodiments of this invention have been described in detail, those skilled in the art will recognize that many variations and modifications may be made in such exemplary embodiments while yet retaining some or all of the novel advantageous features and structures of this invention. Accordingly, all such variations and modifications are intended to be included within the scope of the appended claims.

What is claimed is:

1. Magnetic resonance imaging apparatus comprising:
   a main static magnetic field generator having a first magnetic pole magnetically connected but physically supported and spaced apart from a second magnetic pole by a pair of magnetically permeable columns to define an image volume of approximately homogeneous magnetic field located in an air gap between said poles and between said columns, said poles having respective transverse central axes that are substantially aligned and passing centrally through said image volume, and
   a patient transport disposed to support and move a patient within said image volume along a longitudinal axis of the transport and of the patient lying thereon,
   said pair of columns being angularly disposed relative to the image volume and the longitudinal axis of the patient transport so as to permit open and unobstructed access to the image volume along a direction perpendicular to said longitudinal axis.

2. Magnetic resonance imaging apparatus as in claim 1 wherein said longitudinal axis of the transport is at least 3° off-perpendicular with respect to a line passing through the center of each column.

3. Magnetic resonance imaging apparatus as in claim 1 wherein:
   said columns are symmetrically located on opposite sides of said poles to define a symmetry axis of the magnetic circuit which passes through said image volume and through each column;
   said longitudinal axis of the transport being at an angle of at least 3° off-perpendicular with respect to said symmetry axis.

4. Magnetic resonance imaging apparatus as in claim 2 wherein said longitudinal axis of the transport passes substantially through said transverse central axes of the poles.

5. Magnetic resonance imaging apparatus as in claim 2 wherein said longitudinal axis of the transport is offset by at least 1 cm from the transverse central axes of the poles.

6. Magnetic resonance imaging apparatus as in claim 2 wherein the off-perpendicular angle is sufficiently large as to cause an outer edge of the transport to be substantially adjacent one of the columns.

7. Magnetic resonance imaging apparatus as in claim 2 wherein the off-perpendicular angle is sufficiently large as to cause outer opposite side edges of the transport to be substantially adjacent respectively associated columns.

8. Magnetic resonance imaging apparatus as in claim 3 wherein the off-perpendicular angle between the longitudinal axis of the transport and the symmetry axis of the magnetic circuit is sufficiently large as to cause outer opposite side edges of the transport to be substantially adjacent respectively associated columns.

9. Magnetic resonance imaging apparatus as in claim 5 wherein the off-perpendicular angle is sufficiently large as to cause an outer edge of the transport to be substantially adjacent one of the columns.

10. Magnetic resonance imaging apparatus as in claim 6 wherein said substantially adjacent transport edge and column are in contact with each other.

11. Magnetic resonance imaging apparatus as in claim 7 wherein the off-perpendicular angle is sufficiently large as to cause outer opposite side edges of the transport to be substantially adjacent respectively associated columns.

12. Magnetic resonance imaging apparatus as in claim 8 wherein the off-perpendicular angle is sufficiently large as to cause outer opposite side edges of the transport to be substantially adjacent respectively associated columns.

13. Magnetic resonance imaging apparatus as in claim 9 wherein the off-perpendicular angle is sufficiently large as to cause an outer edge of the transport to be substantially adjacent one of the columns.

14. A method for improving side access in magnetic resonance imaging apparatus having a main static magnetic field generator including a pair of magnetically permeable columns between which an image volume of approximately homogeneous magnetic field is located in an air gap and a patient transport disposed to support a patient within said image volume along a longitudinal axis of the transport and of the patient lying thereon, said method comprising:
   angularly disposing said pair of columns relative to the image volume and longitudinal axis of the patient transport so as to permit open and unobstructed access to the image volume along a direction perpendicular to said longitudinal axis.

15. A method as in claim 14 wherein:
   said columns are symmetrically disposed on opposite sides of said image volume to define a symmetry axis which passes through said image volume and through each column;
   said longitudinal axis of the transport being at an angle of at least 3° off-perpendicular with respect to said symmetry axis.

16. A method as in claim 14 wherein said longitudinal axis of the transport is at least 3° off-perpendicular with respect to a line passing through the center of each column.

17. A method as in claim 15 wherein the off-perpendicular angle is sufficiently large as to cause an outer edge of the transport to be substantially adjacent one of the columns.

18. A method as in claim 15 wherein the off-perpendicular angle is sufficiently large as to cause outer opposite side edges of the transport to be substantially adjacent respectively associated columns.

* * * * *